(12) United States Patent
Hu et al.

(10) Patent No.: US 12,198,649 B2
(45) Date of Patent: Jan. 14, 2025

(54) DISPLAY PANEL AND MOBILE TERMINAL WITH REDUCE CROSSTALK AND IMPROVED CHARGING UNIFORMITY

(71) Applicant: Shenzhen China Star Optoelectronics Semiconductor Display Technology Co., Ltd., Guangdong (CN)

(72) Inventors: Chunxiao Hu, Guangdong (CN); Yoonsung Um, Guangdong (CN); Juncheng Xiao, Guangdong (CN); Ji Li, Guangdong (CN); Yun Yu, Guangdong (CN); Xiaojin He, Guangdong (CN); Jinming Liu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/605,302

(22) PCT Filed: Aug. 27, 2021

(86) PCT No.: PCT/CN2021/115010
§ 371 (c)(1),
(2) Date: Oct. 21, 2021

(87) PCT Pub. No.: WO2023/019629
PCT Pub. Date: Feb. 23, 2023

(65) Prior Publication Data
US 2024/0029679 A1    Jan. 25, 2024

(30) Foreign Application Priority Data
Aug. 19, 2021 (CN) .......................... 202110952658.2

(51) Int. Cl.
*G09G 3/36* (2006.01)
*H01L 27/12* (2006.01)

(52) U.S. Cl.
CPC ......... *G09G 3/3614* (2013.01); *H01L 27/124* (2013.01); *G09G 2300/0413* (2013.01);
(Continued)

(58) Field of Classification Search
CPC ......... G09G 3/3614; G09G 2300/0413; G09G 2300/0452; G09G 2320/0209; G09G 2320/0666; G09G 2330/021; H01L 27/124
See application file for complete search history.

(56) References Cited

U.S. PATENT DOCUMENTS

2006/0120160 A1    6/2006  Park et al.
2008/0074601 A1    3/2008  Lee et al.
(Continued)

FOREIGN PATENT DOCUMENTS

CN        104090440        10/2014
CN        104238165        12/2014
(Continued)

OTHER PUBLICATIONS

International Search Report and the Written Opinion Dated May 16, 2022 From the International Searching Authority Re. Application No. PT/CN2021/115010 and Its Translation Into English. (17 Pages).
(Continued)

*Primary Examiner* — Afroza Chowdhury
(74) *Attorney, Agent, or Firm* — PV IP PC; Wei Te Chung

(57) ABSTRACT

This application discloses a display panel and a mobile terminal. The display panel includes a pixel array and data lines. The pixel array includes sub-pixels. A data line is connected to sub-pixels with same polarity in a column of (Continued)

sub-pixels, and the data line and sub-pixels connected to the data line are spaced by at least one sub-pixel, to form a column-spaced connection manner between the data line and the sub-pixels. Thereby, the display panel can reduce crosstalk and improve the charging uniformity.

20 Claims, 4 Drawing Sheets

(52) U.S. Cl.
CPC .............. *G09G 2300/0452* (2013.01); *G09G 2320/0209* (2013.01); *G09G 2320/0666* (2013.01); *G09G 2330/021* (2013.01)

(56) References Cited

U.S. PATENT DOCUMENTS

| | | | | |
|---|---|---|---|---|
| 2009/0315911 | A1* | 12/2009 | Ohnishi | G09G 5/026 345/593 |
| 2011/0292096 | A1* | 12/2011 | Ohhara | G09G 3/3611 345/690 |
| 2012/0092307 | A1 | 4/2012 | Guo et al. | |
| 2012/0169688 | A1* | 7/2012 | Chen | G09G 3/003 359/463 |
| 2015/0061986 | A1 | 3/2015 | Song et al. | |
| 2015/0380435 | A1* | 12/2015 | Li | G02F 1/1368 257/72 |
| 2016/0104442 | A1* | 4/2016 | Jin | G09G 3/3614 345/92 |
| 2020/0118511 | A1* | 4/2020 | Chen | G09G 3/20 |
| 2020/0225527 | A1* | 7/2020 | Long | G02F 1/13624 |

FOREIGN PATENT DOCUMENTS

| | | |
|---|---|---|
| CN | 104317121 | 1/2015 |
| CN | 104460153 | 3/2015 |
| CN | 106991953 | 7/2017 |
| CN | 110109309 | 8/2019 |
| CN | 110473489 | 11/2019 |
| CN | 111323977 | 6/2020 |
| CN | 112086079 | 12/2020 |
| CN | 112185315 | 1/2021 |
| CN | 113777839 | 12/2021 |
| KR | 10-2015-0008826 | 1/2015 |

OTHER PUBLICATIONS

Notification of Office Action and Search Report Dated222 From The State Intellectual Property Office of the People's Republic of China Re. Application No. 202110952658.2 and Its Translation Into English. (11 Pages).

\* cited by examiner

DISPLAY PANEL AND MOBILE TERMINAL WITH REDUCE CROSSTALK AND IMPROVED CHARGING UNIFORMITY

RELATED APPLICATIONS

This application is a National Phase of PCT Patent Application No. PCT/CN2021/115010 having International filing date of Aug. 27, 2021, which claims the benefit of priority of Chinese Patent Application No. 202110952658.2 filed on Aug. 19, 2021. The contents of the above applications are all incorporated by reference as if fully set forth herein in their entirety.

FIELD AND BACKGROUND OF THE INVENTION

The present invention relates to display technologies, and more particularly, to a display panel and a mobile terminal.

A thin film transistor liquid crystal display (TFT-LCD) is one of main products of current flat panel displays, and with the development of display technologies, requirements on resolution of displayed pictures and picture quality of a display are increasingly high.

However, an increase in the resolution requires a narrower line width of a (TFT) and a pixel pitch may also decrease, resulting in problems such as crosstalk, charging, and image sticking. These problems become several main challenges hindering picture quality improvement, and a vertical alignment liquid crystal display (VA-LCD) is prone to a problem of picture crosstalk. A solution for reducing crosstalk from the aspect of the pixel structure is to increase a line pitch, which, however, leads to a decrease in the aperture ratio, and is contrary to the development toward high resolution. In contract, reducing crosstalk from the aspect of the display panel is a feasible implementation solution, which is mainly to compensate for pixel coupling, thereby improving the picture quality of a display.

Existing conventional display panels mainly include the following two types: one is a column inversion display panel (Strip framework) shown in FIG. 1(a), the display panel uses a column inversion driving mode, and has low power consumption and a high charging rate, but the display panel has a disadvantage of having a longitudinal crosstalk risk; and another is a dot inversion display panel (flip framework) shown in FIG. 2(a), the framework may implement a display effect of dot inversion and has a low crosstalk risk, but the display panel has a disadvantage of relatively poor charging uniformity.

SUMMARY OF THE INVENTION

Embodiments of this application provide a display panel and a mobile terminal, to overcome existing disadvantages of relatively poor charging uniformity of a dot inversion display panel and longitudinal crosstalk of a column inversion display panel.

The embodiments of this application provide a display panel, including: a pixel array, including sub-pixels arranged in an array, polarities of two adjacent sub-pixels arranged in a first direction being opposite, and polarities of two adjacent sub-pixels in the same column of sub-pixels being opposite; and at least one data line disposed in a second direction, the second direction and the first direction being perpendicular to each other, where at least one data line is disposed between the two adjacent sub-pixels arranged in the first direction; in two adjacent data lines, one of the two adjacent data lines is connected to at least one sub-pixel with positive polarity, and another one of the two adjacent data lines is connected to at least one sub-pixel with negative polarity; and any data line and a sub-pixel to which the data line is connected are spaced by at least one sub-pixel.

Further, in the same column of sub-pixels, first connecting lines are parallel to each other, second connecting lines are parallel to each other, the first connecting line is a connecting line between a sub-pixel with positive polarity and a corresponding data line, and the second connecting line is a connecting line between a sub-pixel with negative polarity and a corresponding data line.

Further, an extension line of the first connecting line intersects an extension line of the second connecting line.

Further, the first connecting line and the second connecting line are parallel to each other.

Further, in the same column of sub-pixels, a data line corresponding to at least one sub-pixel with positive polarity is located on one side of the column of sub-pixels, and a data line corresponding to at least one sub-pixel with negative polarity is located on an other side of the column of sub-pixels, so that a wiring direction of the first connecting line is opposite to a wiring direction of the second connecting line.

Further, a quantity of columns of sub-pixels between the data line corresponding to the at least one sub-pixel with positive polarity in a column of sub-pixels and the data line corresponding to the at least one sub-pixel with negative polarity in the same column of sub-pixels is 3.

Further, a column of dummy pixels are disposed on an outer side of each of two ends of the pixel array, a data line is disposed between the dummy pixels and adjacent sub-pixels, and a data line is disposed on an outer side of one end of the dummy pixels away from the adjacent sub-pixels.

Further, a difference between a total quantity of data lines and a total quantity of columns of sub-pixels is greater than or equal to 3.

Further, the display panel includes a display area, the display area includes an upper frame, a middle frame, and a lower frame arranged in the second direction, and when a color in the display area corresponding to the middle frame is yellow, colors in the display area corresponding to the upper frame and in the display area corresponding to the lower frame are both black.

The embodiments of this application further provide a mobile terminal, including a terminal body and the display panel described above.

The beneficial effects of this application are: a charging manner a data line and sub-pixels with same polarity of a pixel unit are connected in a column-spaced manner is used, namely, any data line and a pixel unit of sub-pixels to which the data line is connected are spaced by at least one column of sub-pixels, so as to cause the display panel of the present invention to both have an advantage of a low crosstalk risk as a dot inversion pixel driving framework and advantages of a high charging rate and good charging uniformity as a column inversion pixel driving framework, thereby achieving objectives of reducing crosstalk and improving the charging uniformity. The display panel provided in the present invention can reduce crosstalk and provide relatively good charging uniformity, thereby improving display quality of the display panel.

BRIEF DESCRIPTION OF THE SEVERAL VIEWS OF THE DRAWINGS

The following describes specific implementations of this application in detail with reference to the accompanying drawings, to make the technical solutions and other beneficial effects of this application obvious.

Figure 3:
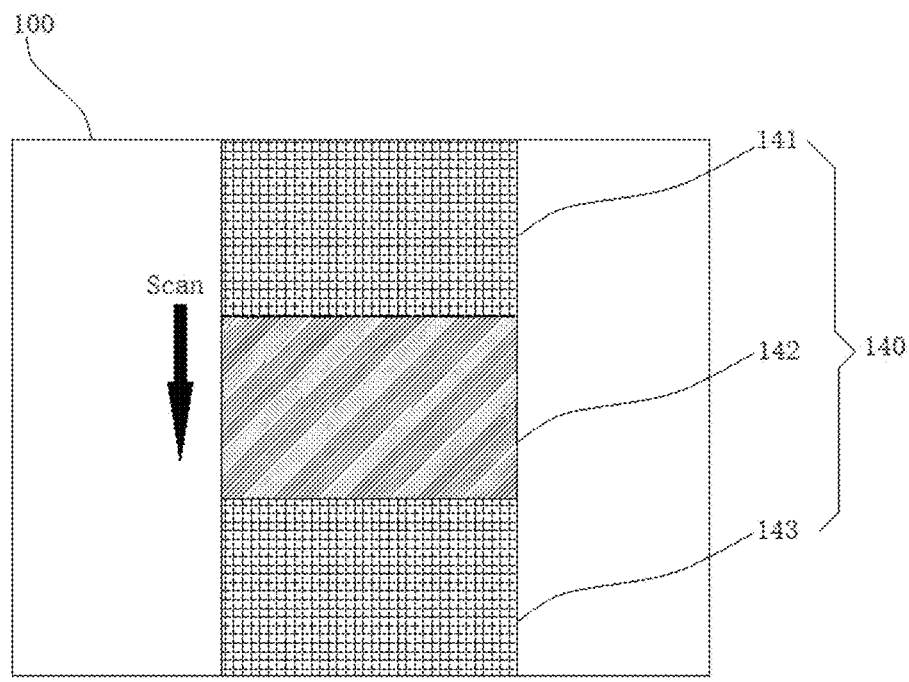
FIG. 3 is a schematic diagram of a display panel picture when a yellow frame is displayed in a pixel driving framework.
Figure 4:
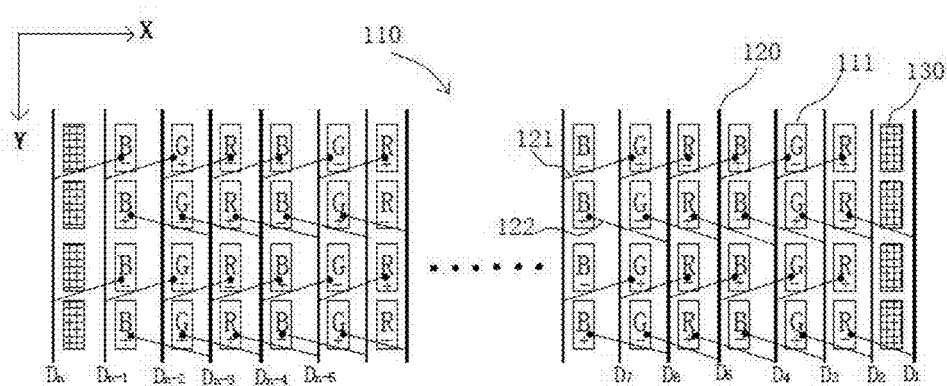
FIG. 4 is a schematic structural diagram of a pixel array in a display panel according to an exemplary embodiment of the present invention.

In the figures, X is a first direction, Y is a second direction, + represents a positive electrode, and − represents a negative electrode; and Arrow directions in FIG. 3 and FIG. 4 represent a scan direction.

DESCRIPTION OF REFERENCE NUMERALS

100: Display panel; 110: Pixel array; 111: Sub-pixel; 120: Data line; 121: First connecting line; 122: Second connecting line; 130: Dummy pixel; 140: Display area; 141: Upper frame; 142: Middle frame; 143: Lower frame; 144: Acom electrode.

DESCRIPTION OF SPECIFIC EMBODIMENTS OF THE INVENTION

The technical solutions of the embodiments of the present invention are clearly and completely described in the following with reference to the accompanying drawings of the embodiments of the present invention. Apparently, the described embodiments are merely some but not all of the embodiments of the present invention. All other embodiments obtained by a person skilled in the art based on the embodiments of the present invention without creative efforts shall fall within the protection scope of the present invention.

In a display panel, a data line is connected to sub-pixels with same polarity in a spaced column of sub-pixels in a pixel array. That is, the data line and connected sub-pixels are spaced by at least one column of sub-pixels, to form a column-spaced connection manner between the data line and the sub-pixels. Thereby, the display panel of the present invention can reduce crosstalk and improve the charging uniformity. As a typical application, the display panel of the present invention may be applied to a mobile terminal. For example, the mobile terminal may be a digital camera, a camera, a portable camera, a personal digital assistant, a smartphone, an ultra-thin notebook computer, a tablet computer, and a flexible display.

Referring to FIG. 4, in an embodiment of the present invention, a display panel 100 includes a pixel array 110 and data lines 120. The pixel array 110 includes a plurality of sub-pixels 111 arranged in an array, a first direction X in FIG. 4 is a row direction of the pixel array 110, and a second direction Y is a column direction of the pixel array 110. In each row of sub-pixels 111, polarities of two adjacent sub-pixels 111 are opposite, and in each column of sub-pixels, polarities of two adjacent sub-pixels 111 are opposite, thereby forming a dot inversion arrangement manner of sub-pixels in the pixel array 110. Pixel colors of sub-pixels 111 in each column of sub-pixels in the pixel array 110 are the same, for example, are all red (R), green (G), or blue (B). A data line 120 is connected to sub-pixels 111 with same polarity in one column of sub-pixels. Pixel colors of sub-pixels 111 in two adjacent columns of sub-pixels are different. For example, colors of sub-pixels 111 in one column of sub-pixels are red (R), and pixel colors of sub-pixels 111 in another column of sub-pixels are green (G) or blue (B). Further, pixel colors of three adjacent sub-pixels 111 arranged in the first direction X (that is, the row direction) are different from each other. For example, pixel colors of one column of sub-pixels are red (R), pixel colors of an other column of sub-pixels are green (G), and pixel colors of a third column of sub-pixels are blue (B).

In this embodiment, a data line 120 is disposed between two adjacent columns of sub-pixels, and in two adjacent data lines 120, one of the two adjacent data lines 120 is connected to sub-pixels 111 with positive (+) polarity in a column of sub-pixels, and another one of the two adjacent data lines 120 is connected to sub-pixels 111 with negative (−) polarity in a column of sub-pixels. In addition, any data line 120 and sub-pixels 111 to which the data line 120 is connected are spaced by at least one column of sub-pixels, thereby implementing column-spaced connection between the data line 120 and the sub-pixels 111. In this embodiment, the column-spaced connection is one column-spaced connection. Certainly, the data line 120 and the sub-pixels 111 may be connected and spaced by two columns or a plurality of columns. However, an aperture ratio may be reduced, thereby affecting the picture quality. A specific quantity of columns spaced may be determined according to an actual generation requirement. A quantity of sub-pixels 111 in a column of sub-pixels is at least one.

In this embodiment, Referring to FIG. 4, in the same column of sub-pixels, connecting lines between sub-pixels 111 with positive polarity and a corresponding data line 120 are first connecting lines 121, connecting lines between sub-pixels 111 with negative polarity and a corresponding data line 120 are second connecting lines 122, the first connecting lines 121 are parallel to each other, the second connecting lines 122 are parallel to each other, and an extension line of the first connecting line 121 intersects (that is, is not parallel to) an extension line of the second connecting line 122. For ease of wiring, the first connecting lines 121 are parallel to each other, and the second connecting lines 122 are parallel to each other, to avoid signal interference generated due to staggered connecting lines. As a preferred implementation, the first connecting line 121 and the second connecting line 122 are parallel to each other.

In the display panel 100 provided in this embodiment, an arrangement manner of the sub-pixels 111 in the pixel array 110 uses a dot inversion arrangement manner, so that the display panel 100 of the present invention has an advantage of a low crosstalk risk of a dot inversion pixel driving framework. In addition, although the display panel of the present invention uses the dot inversion arrangement manner of the sub-pixels 111, a connection manner between the data line 120 and the sub-pixels 111 does not use a connection manner of the dot inversion pixel driving framework in the related art (an existing connection manner of the dot inversion pixel driving framework is: the data line 120 is connected to sub-pixels 111 with same polarity in two adjacent columns of sub-pixels, and reference may be made to FIG. 2(a), polarities of sub-pixels 111 of adjacent columns are opposite), but uses a connection manner the data line 120 is connected to sub-pixels 111 with same polarity (positive or negative) in the same column of sub-pixels, besides, any data line 120 and a column of sub-pixels 111 to which the data line 120 is connected are spaced by a (or one column of) sub-pixel 111.

As an improvement, a column of dummy pixels 130 are disposed on an outer side of each of two ends of the pixel array 110 in the second direction Y, a data line 120 is disposed between the dummy pixels 130 and adjacent sub-pixels 111, and a data line 120 is disposed on an outer side of one end of the dummy pixels 130 away from the adjacent sub-pixels 111. Referring to FIG. 4, since the data line 120 and the sub-pixels 111 are connected in a column-spaced manner, to ensure sub-pixels 111 with same polarity in each column of sub-pixels to be connected to a data line 120, a quantity of data lines 120 is increased, and a total quantity of data lines 120 is equal to a total quantity of columns of sub-pixels plus 3. Specifically, referring to FIG. 4, a plurality of data lines 120 spaced and arranged in parallel in the first direction X are numbered from $D_1$ to $D_n$ to form $D_1$ to $D_n$, one number corresponds to one data line 120, n represents the total quantity of data lines 120, and for example, if there are 100 data lines 120 in total in the display panel 100, n is 100. The sub-pixels 111 are spaced and arranged between a data line 120 with a number of $D_2$ and a data line 120 with a number of $D_{n-1}$, and a quantity of data lines 120 between two adjacent columns of sub-pixels is 1.

In this embodiment, a column of dummy pixels 130 are disposed between a data line 120 with the number of $D_1$ and the data line 120 with the number of $D_2$; and a column of dummy pixels 130 are disposed between a data line 120 with the number of $D_n$ and the data line 120 with the number of $D_{n-1}$. A design of the dummy pixels 130 may ensure picture quality of edges of a display area.

In this embodiment, referring to FIG. 4, in the same column of sub-pixels, a data line 120 corresponding to at least one sub-pixel 111 with positive polarity is located on one side of the column of sub-pixels, and a data line 120 corresponding to at least one sub-pixel 111 with negative polarity is located on an other side of the column of sub-pixels, so that a wiring direction of the first connecting line 121 is opposite to a wiring direction of the second connecting line 122. That is, the data line 120 connected to the at least one sub-pixel 111 with positive polarity and the data line connected to the at least one sub-pixel 111 with negative polarity are located on two sides of the column of sub-pixels, so that the wiring direction of the first connecting line 121 is opposite to that of the second connecting line 122, thereby further reducing a crosstalk risk.

A quantity of columns of sub-pixels between the data line 120 corresponding to the at least one sub-pixel 111 with positive polarity in a column of sub-pixels and the data line 120 corresponding to the at least one sub-pixel 111 with negative polarity in the same column of sub-pixels is 3. That is, one column of sub-pixels correspond to two data lines 120, and a quantity of columns of sub-pixels between the two data lines 120 is 3, to implement column-spaced connection between sub-pixels 111 with opposite polarities in the same column of sub-pixels and corresponding data lines 120. The connection manner in the present invention has a similarity and a difference with a connection manner in a column inversion pixel driving framework (referring to FIG. 1(a)) in the related art:

The similarity lies in that, in the two connection manners, a data line 120 is both connected to sub-pixels 111 with same polarity in the same column of sub-pixels. The similarity causes the display panel provided in the present invention to have advantages of low power consumption and a high panel charging rate of the existing column inversion pixel driving framework.

The difference lies in that, in the present invention, a data line 120 is connected to sub-pixels 111 with same polarity in a column-spaced manner, and in the existing column inversion pixel driving framework, a data line 120 is connected to sub-pixels of adjacent columns. The difference causes the display panel provided in the present invention to both reduce a longitudinal crosstalk risk and have advantages of low power consumption, a high charging rate, and good charging uniformity, thereby improving the picture quality of the display panel.

Figure 1A:
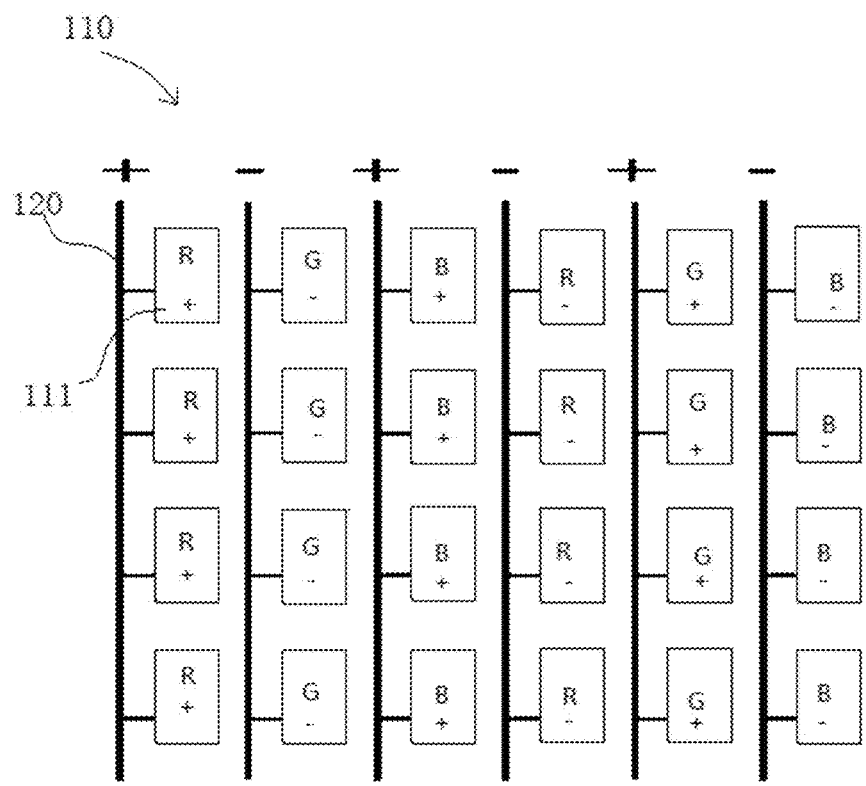
FIG. 1(a) is a schematic diagram of a display panel using a column inversion driving mode in the related art.
Figure 1B:
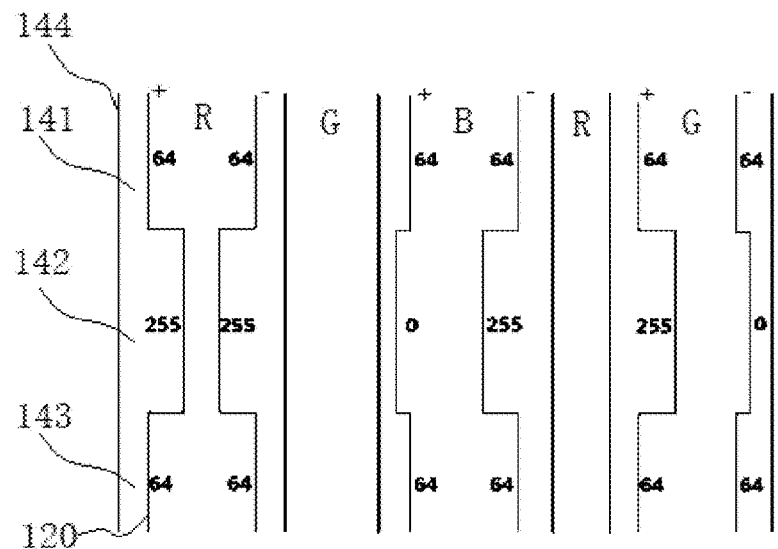
FIG. 1(b) is a schematic diagram of pixel coupling of data signals when a display panel picture in a column inversion display panel displays a yellow frame.
Figure 2A:
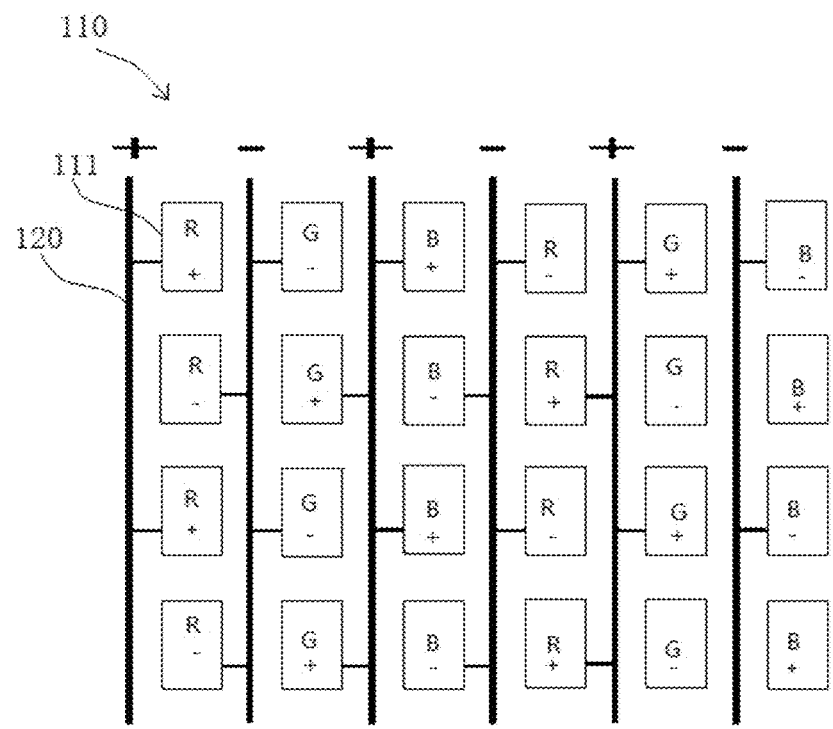
FIG. 2(a) is a schematic diagram of a display panel using a dot inversion driving mode in the related art.
Figure 2B:
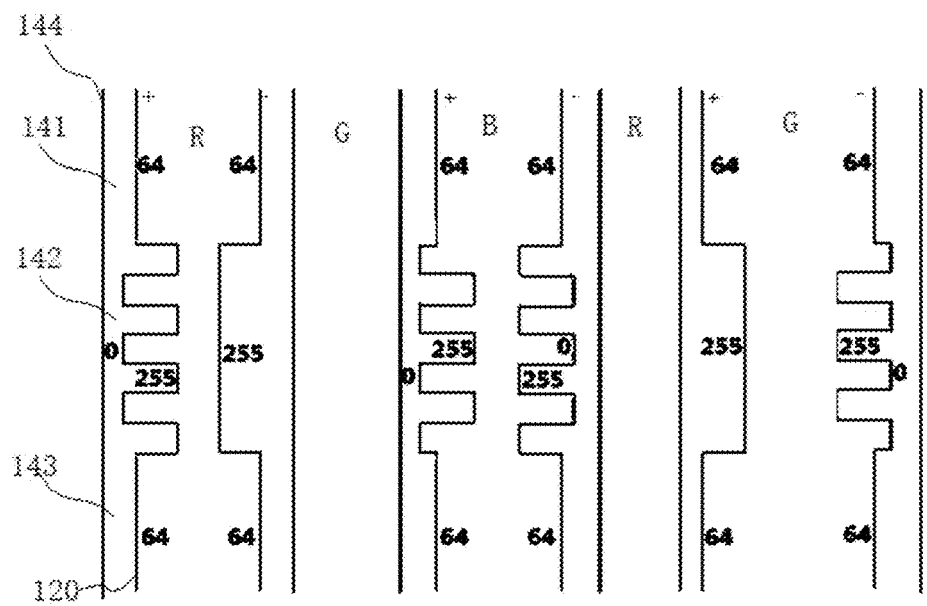
FIG. 2(b) is a schematic diagram of pixel coupling of data signals when a display panel picture in a dot inversion display panel displays a yellow frame.

The display panel 100 includes a display area 140, and the display area 140 includes an upper frame 141, a middle frame 142, and a lower frame 143 sequentially arranged in the second direction Y. Crosstalk of displayed pictures in the display area 140 is described in detail below:

1) for a schematic diagram of pixel coupling of the column inversion pixel driving framework shown in FIG. 1(a), reference may be made to FIG. 1(b). FIG. 1(b) is a schematic diagram of pixel coupling of data signals when a picture of the middle frame 142 in the column inversion pixel driving framework displays a yellow frame (that is, 255 gray levels). An Acom electrode (common electrode) 144 is disposed between two adjacent columns of sub-pixels, as can be seen from FIG. 1(b), in a condition of 64 gray levels, a color displayed in the display area corresponding to the upper frame 141 is slightly light and slightly red, a color displayed in the display area corresponding to the lower frame 143 is dark red and slightly purple, leading to color cast and a crosstalk risk when a display panel using the column inversion pixel driving framework displays a picture;

2) for a schematic diagram of pixel coupling of the dot inversion pixel driving framework shown in FIG. 2(a), reference may be made to FIG. 2(b). FIG. 2(b) is a schematic diagram of pixel coupling of data signals when a picture of the middle frame of a display panel in the dot inversion pixel driving framework displays a yellow frame. In a condition of 64 gray levels, in the upper frame 141 and the lower frame 143, coupling directions of adjacent red (R) sub-pixels and greed (G) sub-pixels in the same row are opposite, and coupling directions of two adjacent blue (B) sub-pixels in the same row are opposite, so that colors of the display area corresponding to the upper frame 141 and the display area corresponding to the lower frame 143 are both black, a displayed picture has no color cast and has a low crosstalk risk; and 3) by using the display panel provided in the present invention, referring to FIG. 3, sub-pixels 111 in the pixel array 110 are arranged in a dot inversion arrangement manner, so that when the display panel displays a yellow frame, the schematic diagram of pixel coupling shown in FIG. 2(b) is included, and a displayed picture has no color cast and has a low crosstalk risk.

The yellow frame represents that a color displayed by the display area corresponding to the middle frame 142 are yellow.

If the coupling directions are the same, the coupling directions are both concave or are both convex; and if the coupling directions are opposite, one of the coupling directions is concave and an other of the coupling directions is convex, or one of the coupling directions is convex and an other of the coupling directions is concave.

There are obvious differences between connection manners and sub-pixel arrangement manners between a dot inversion display panel and a column inversion display panel, so that the two display panels have respective advantages (a displayed picture of the dot inversion pixel driving framework has a low crosstalk risk; and the column inversion display panel has low power consumption and a high panel charging rate) and respective disadvantages (the dot inversion display panel has a problem of relatively poor charging uniformity; and a displayed picture of the column inversion display panel has a crosstalk risk). In other words, only one of the advantages of the two display panels may be selected, and the advantages of the two display panels cannot be owned at the same time.

The display panel 100 provided in the present invention makes best use of the advantages of the two display panels and bypasses the disadvantages, so that by using the display panel 100 provided in the present invention, the longitudinal crosstalk risk may be reduced, and the display panel may have advantages of low power consumption, a high charging rate, and good charging uniformity, thereby improving the picture quality of the display panel.

Figure 5:
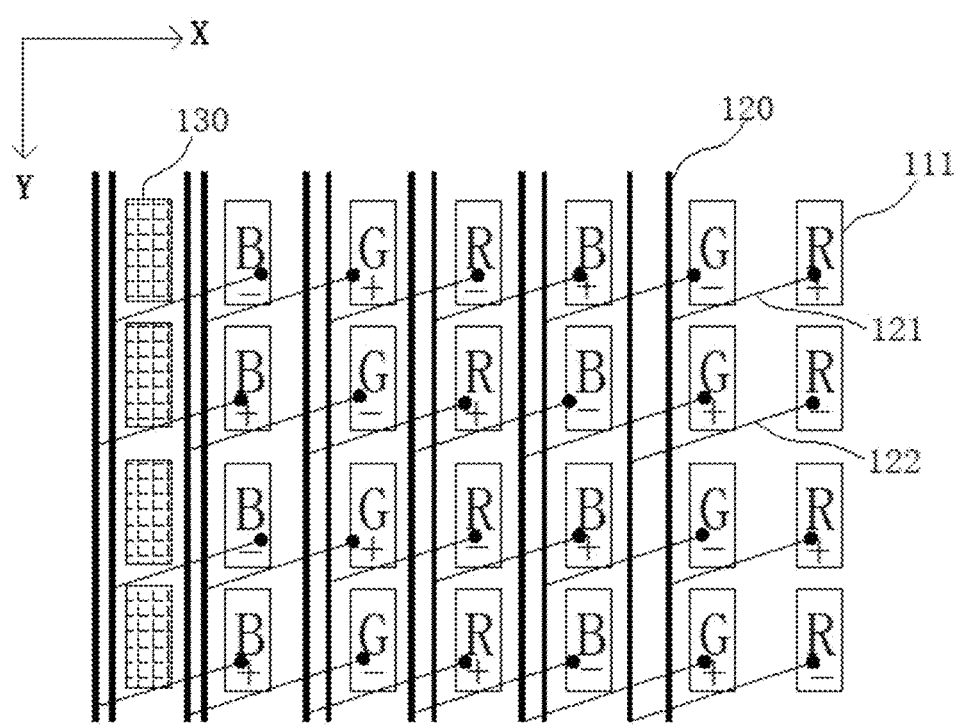
FIG. 5 is a schematic structural diagram of a pixel array in a display panel according to another exemplary embodiment of the present invention.

As an improvement, referring to FIG. 5, two data lines 120 are disposed between an $(N+1)^{th}$ column of sub-pixels and an $(N+2)^{th}$ column of sub-pixels, where N is an integer greater than or equal to 1. Sub-pixels 111 with positive polarity in an $N^{th}$ column of sub-pixels are connected to one data line 120 between the $(N+1)^{th}$ column of sub-pixels and the $(N+2)^{th}$ column of sub-pixels, and sub-pixels 111 with negative polarity in the $N^{th}$ column of sub-pixels are connected to the other data line 120 between the $(N+1)^{th}$ column of sub-pixels and the $(N+2)^{th}$ column of sub-pixels.

Using an example in which N is the smallest value 1, when N is equal to 1, two data lines 120 are disposed between a second column of sub-pixels and a third column of sub-pixels, sub-pixels 111 with positive polarity in a first column (a rightmost column in FIG. of sub-pixels are connected to one data line 120 between the second column of sub-pixels and the third column of sub-pixels, and sub-pixels 111 with negative polarity in the first column of sub-pixels are connected to the other data line 120 between the second column of sub-pixels and the third column of sub-pixels.

In this embodiment, referring to FIG. 5, no data line is disposed between one column of sub-pixels of two columns of sub-pixels located on two ends of the pixel array 110 and an adjacent column of sub-pixels; and two groups of data lines are disposed on one side away from an adjacent column of sub-pixels of one column of sub-pixels located on one side of the two sides of the pixel array 110, where each group includes two data lines 120, and dummy pixels 130 are disposed between the two groups of data lines. In this case, since N is the smallest value 1, two data lines 120 are disposed between the second column of sub-pixels and the third column of sub-pixels. Therefore, using FIG. 5 as an example, in two columns of sub-pixels on two ends of the pixel array 110, the pixel array 110 totally includes 8 columns of sub-pixels, and the two columns of sub-pixels located on the two ends of the pixel array 110 are the first column (the rightmost column in FIG. 5) of sub-pixels and an eighth column (a leftmost column in FIG. 5) of sub-pixels. No data line is disposed between the first column of sub-pixels and the second column of sub-pixels, two groups of data lines are disposed on outer sides of the eighth column of sub-pixels, and each group includes two data lines 120, for ease of column-spaced connection respectively formed by a seventh column of sub-pixels and the eighth column of sub-pixels with corresponding data lines 120.

In this embodiment, in the same column of sub-pixels, a first connecting line 121 between a sub-pixel 111 with positive polarity and a corresponding data line 120 and a second connecting line 122 between a sub-pixel 111 with negative polarity and a corresponding data line 120 are parallel to each other.

In conclusion, although preferred embodiments of this application are already disclosed above, the preferred embodiment are not intended to limit this application. A person of ordinary skill in the art can make various changes and modifications without departing from the spirit and scope of this application. Therefore, the protection scope of this application is subject to the scope defined by the claims.

What is claimed is:

1. A display panel, comprising:
a pixel array comprising sub-pixels arranged in an array, wherein polarities of two adjacent sub-pixels arranged in a first direction are opposite, and polarities of two adjacent sub-pixels in a same column of the sub-pixels are opposite; and
data lines, wherein at least one data line is disposed in a second direction, the second direction and the first direction are perpendicular to each other, and wherein
the at least one data line is disposed between the two adjacent sub-pixels arranged in the first direction;
in two adjacent data lines, one of the two adjacent data lines is connected to at least one of the sub-pixels with positive polarity of a same column of sub-pixels in the second direction, and another one of the two adjacent data lines is connected to at least one of the sub-pixels with negative polarity of a same column of sub-pixels in the second direction; and
for any of the data lines, there is at least one other sub-pixel interposed between the data line and each sub-pixel connected to it.

2. The display panel according to claim 1, wherein in the same column of sub-pixels, first connecting lines are parallel to each other, second connecting lines are parallel to each other, each of the first connecting lines is a connecting line between the sub-pixel with positive polarity and the corresponding data line, and each of the second connecting lines is a connecting line between the sub-pixel with negative polarity and the corresponding data line.

3. The display panel according to claim 2, wherein extension lines of the first connecting lines intersect extension lines of the second connecting lines.

4. The display panel according to claim 2, wherein the first connecting lines and the second connecting lines are parallel to each other.

5. The display panel according to claim 2, wherein in the same column of sub-pixels, the data line corresponding to at least one of the sub-pixels with positive polarity is located on one side of the column of sub-pixels, the data line corresponding to at least one of the sub-pixels with negative polarity is located on another side of the column of sub-pixels, and a wiring direction of the first connecting line is opposite to a wiring direction of the second connecting line.

6. The display panel according to claim 5, wherein a quantity of columns of the sub-pixels between the data line corresponding to the at least one sub-pixel with positive polarity in the column of sub-pixels and the data line corresponding to the at least one sub-pixel with negative polarity in the same column of sub-pixels is 3.

7. The display panel according to claim 1, wherein a column of dummy pixels are disposed on an outer side of each of two ends of the pixel array, a data line is disposed between the dummy pixels and adjacent sub-pixels, and a data line is disposed on an outer side of one end of the dummy pixels away from the adjacent sub-pixels.

8. The display panel according to claim 1, wherein a difference between a total quantity of data lines and a total quantity of columns of sub-pixels is greater than or equal to 3.

9. The display panel according to claim 1, wherein the display panel comprises a display area, the display area comprises an upper frame, a middle frame, and a lower frame arranged in the second direction, and when a color in the display area corresponding to the middle frame is yellow, colors in the display area corresponding to the upper frame and in the display area corresponding to the lower frame are both black.

10. The display panel according to claim 1, wherein pixel colors of sub-pixels in each column of sub-pixels in the pixel array are the same, and pixel colors of sub-pixels in two adjacent columns of sub-pixels are different.

11. A mobile terminal, comprising a terminal body and a display panel,
the display panel comprising:
a pixel array, comprising sub-pixels arranged in an array, polarities of two adjacent sub-pixels arranged in a first direction being opposite, and polarities of two adjacent sub-pixels in the same column of sub-pixels being opposite; and
at least one data line disposed in a second direction, the second direction and the first direction being perpendicular to each other, at least one data line is disposed between the two adjacent sub-pixels arranged in the first direction;
in two adjacent data lines, one of the two adjacent data lines is connected to at least one sub-pixel with positive polarity of a same column of sub-pixels in the second direction, and another one of the two adjacent data lines is connected to at least one sub-pixel with negative polarity of a same column of sub-pixels in the second direction; and
for any data line, there is at least one other sub-pixel interposed between the data line and each sub-pixel connected to it.

12. The mobile terminal according to claim 11, wherein in the same column of sub-pixels, first connecting lines are parallel to each other, second connecting lines are parallel to each other, the first connecting line is a connecting line between a sub-pixel with positive polarity and a corresponding data line, and the second connecting line is a connecting line between a sub-pixel with negative polarity and a corresponding data line.

13. The mobile terminal according to claim 12, wherein an extension line of the first connecting line intersects an extension line of the second connecting line.

14. The mobile terminal according to claim 12, wherein the first connecting line and the second connecting line are parallel to each other.

15. The mobile terminal according to claim 12, wherein in the same column of sub-pixels, a data line corresponding to at least one sub-pixel with positive polarity is located on one side of the column of sub-pixels, and a data line corresponding to at least one sub-pixel with negative polarity is located on an other side of the column of sub-pixels, so that a wiring direction of the first connecting line is opposite to a wiring direction of the second connecting line.

16. The mobile terminal according to claim 15, wherein a quantity of columns of sub-pixels between the data line corresponding to the at least one sub-pixel with positive polarity in a column of sub-pixels and the data line corresponding to the at least one sub-pixel with negative polarity in the same column of sub-pixels is 3.

17. The mobile terminal according to claim 11, wherein a column of dummy pixels are disposed on an outer side of each of two sides of the pixel array, a data line is disposed between the dummy pixels and adjacent sub-pixels, and a data line is disposed on an outer side of one end of the dummy pixels away from the adjacent sub-pixels.

18. The mobile terminal according to claim 11, wherein a difference between a total quantity of data lines and a total quantity of columns of sub-pixels is greater than or equal to 3.

19. The mobile terminal according to claim 11, wherein the display panel comprises a display area, the display area comprises an upper frame, a middle frame, and a lower frame arranged in the second direction, and when a color in the display area corresponding to the middle frame is yellow, colors in the display area corresponding to the upper frame and in the display area corresponding to the lower frame are both black.

20. The mobile terminal according to claim 11, wherein pixel colors of sub-pixels in each column of sub-pixels in the pixel array are the same, and pixel colors of sub-pixels in two adjacent columns of sub-pixels are different.

* * * * *